United States Patent
Colombo et al.

(10) Patent No.: US 7,208,852 B2
(45) Date of Patent: Apr. 24, 2007

(54) ELECTRONIC TRIPPING DEVICE FOR LOW-VOLTAGE CIRCUIT BREAKERS

(75) Inventors: Severino Colombo, Dalmine (IT); Antonio Maria Gabello, Bergamo (IT)

(73) Assignee: ABB Service S.r.l. (IT)

( * ) Notice: Subject to any disclaimer, the term of this patent is extended or adjusted under 35 U.S.C. 154(b) by 462 days.

(21) Appl. No.: 10/791,731

(22) Filed: Mar. 4, 2004

(65) Prior Publication Data

US 2004/0174644 A1   Sep. 9, 2004

(30) Foreign Application Priority Data

Mar. 7, 2003   (IT)   .......................... BG2003A0017

(51) Int. Cl.
- H01H 3/00 (2006.01)
- H01H 9/54 (2006.01)
- H01H 33/59 (2006.01)
- H01H 47/00 (2006.01)
- H01H 85/46 (2006.01)

(52) U.S. Cl. ....................................... 307/139; 361/42

(58) Field of Classification Search ................ 307/139; 361/23, 42–50
See application file for complete search history.

(56) References Cited

U.S. PATENT DOCUMENTS 4,947,126 A * 8/1990 May et al. .................. 324/509

* cited by examiner

*Primary Examiner*—Brian Sircus
*Assistant Examiner*—Carlos Amaya
(74) *Attorney, Agent, or Firm*—Connolly Bove Lodge & Hutz LLP

(57) ABSTRACT

An electronic tripping device for low-voltage circuit-breakers comprises means for detection and calculation of a ground-fault current operatively connected to tripping means of said circuit-breaker. The means for detection and calculation comprise: current-sensor means, which supply, for each pole, a signal proportional to the current; means for detection of the sign of the current, which, for each pole, supply a signal representing the sign of the current; current-rectifying means, which, for each pole, supply a rectified signal proportional to the current circulating in said pole; and first numerical-processing means, which supply a value with sign representing a ground fault by means of a numerical-processing operation comprising the multiplication of the signal representing the sign by the corresponding rectified signal.

9 Claims, 3 Drawing Sheets

ELECTRONIC TRIPPING DEVICE FOR LOW-VOLTAGE CIRCUIT BREAKERS

BACKGROUND OF THE INVENTION

The present invention relates to an electronic tripping device for low-voltage circuit-breakers and in particular for low-voltage multipolar automatic circuit-breakers for the protection of electrical networks.

Automatic circuit-breakers that perform a function of protection against ground faults use circuits for measurement or reconstruction of the value of the summation of network currents. Normally, an electrical network that is to be protected is made up of electrical conductors, corresponding generally to three phases and to the neutral of an installation. Contacts for closing and opening the circuit enable circulation or interruption of the current in the phase conductors. Normally, in most installations, the neutral conductor is distributed without being interrupted.

A plurality of current transformers T1, T2, T3, and TN associated to the various conductors of the network transform the primary currents of the circuit into secondary currents that are compatible with the electronic contact breakers. The secondary currents are then applied to the input of a circuit for rectification and detection of the phase, neutral, and ground-fault currents. This circuit generally supplies signals representing these currents to an electronic processing device. According to the conditions that arise, the processing device produces a tripping signal, which is applied to the input of a relay control, which in turn actuates a mechanism for opening the contacts of the automatic circuit-breaker.

In some tripping devices of a known type, for example the ones described in EP-A-284 198, measurement of the ground-fault current is made by means of a transformer, the primary winding of which is constituted by all the conductors of the electrical network. The secondary winding of the transformer hence supplies a current proportional to the summation of the currents of the network. A signal representing this secondary current Ih1 is supplied, for example, by the voltage Vh1 to the terminals of a resistor Rh1, which is connected in parallel to the secondary winding of the transformer. The sum of the secondary currents is obtained in a common conductor S1, connected to which is a first end of each of the secondary windings of the current transformers, the second ends of said secondary windings being connected directly to a rectifier circuit. The common conductor is connected, via measurement means, to the rectifier circuit. A current representing the ground-fault current, corresponding to the sum of the secondary currents of all the transformers, thus circulates in the conductor S1. The measurement means can be constituted by a resistor Rh2, the voltage Vh2 at the terminals of which representing the current summation.

In contact breakers that use the effective value RMS of the currents, a total independence of the currents is necessary. In such an embodiment, the two ends of the secondary winding of each current transformer (T1, T2, T3, TN) are connected to the rectifier circuit. The set of the secondary windings constitutes the primary winding of a transformer TSM, which supplies to the terminals of its secondary winding a voltage Vh4 representing the current summation in the network. The signals Vh1, Vh2, Vh3, or Vh4 are then applied to a processing device. In other automatic circuit-breakers, such as for instance the ones described in the patent application No. EP-A-0179017, digital processing circuits calculate a value representing the ground fault as a function of the amplitudes of the current values of the phases and of the neutral.

In other cases, such as for example in the U.S. Pat. No. 4,947,126, a measurement device is used, in which a datum is introduced on the polarity for the purpose of providing ground protection.

For reconstruction of the ground-fault signal, known ground-protection devices use electronic components which occupy considerable space on printed circuits. These components are frequently power transformers, diodes, or resistors. The cost and size of these supplementary power components are considerable for contact breakers installed in low-calibre automatic circuit-breakers.

Digital-processing contact breakers reduce the number of power components, but sampler/limiter circuits are necessary for simultaneous measurement of the values of the currents. Furthermore, the known algorithms for calculation of the value of the ground-fault current are not suited to all the configurations of phase and neutral currents, especially in the case where the currents do not present a pure sinusoidal form.

SUMMARY OF THE INVENTION

A primary task of the present invention is to provide an electronic tripping device for low-voltage circuit-breakers, and in particular an electronic tripping device for low-voltage multipolar automatic circuit-breakers for protection of an electrical network which does not require a large number of electronic power components.

Within the framework of this task, one of the purposes of the present invention is to provide an electronic tripping device for low-voltage circuit-breakers that will enable determination in a relatively simple manner of the presence of ground faults.

Yet a further purpose of the present invention is to provide an electronic tripping device for low-voltage circuit-breakers which, as compared to systems of a known type, does not call for complicated operations of mathematical processing of the signals acquired.

Not the least important purpose of the present invention is to provide an electronic tripping device for low-voltage circuit-breakers that will present high reliability, relative ease of construction, and competitive costs.

The above task and the above purposes, as well as others that will appear more evidently from the ensuing description are achieved by an electronic tripping device for low-voltage circuit-breakers, in particular for low-voltage multipolar automatic circuit-breakers, which comprises means for detection and calculation of a ground-fault current operatively connected to tripping means of said circuit-breaker. Said means for detection and calculation comprise:

- current-sensor means, which supply, for each pole, a signal that is proportional to the current circulating therein;
- means for detection of the sign of the current, the input of which is operatively connected to said current-sensor means, which, for each pole, supply at output a two-level signal representing the sign of the current in said pole;
- current-rectifying means, the input of which is operatively connected to said current-sensor means, which, for each pole, supply at output a rectified signal proportional to the current circulating in said pole; and
- first numerical-processing means, the input of which is operatively connected to said means for detection of the sign of the current and to said current-rectifying means, said first processing means supplying at output, with a predetermined periodicity, a value with sign representing a ground fault by means of a numerical-processing operation that comprises, for each pole, the multiplication of said two-level signal with the corresponding rectified signal proportional to the current circulating in said pole.

In this way, thanks to the innovative idea of the invention, the electronic tripping device according to the invention renders possible the generation of tripping signals via a relatively small number of electronic components and without resorting to complicated systems of numerical processing.

BRIEF DESCRIPTION OF THE DRAWINGS

Further characteristics and advantages will emerge more clearly from the description of preferred, but non-exclusive, embodiments of an electronic tripping device for low-voltage circuit-breakers, in particular for low-voltage multipolar automatic circuit-breakers, according to the invention, illustrated by way of indicative and non-limiting example with the aid of the attached drawings, in which.

DETAILED DESCRIPTION

The electronic tripping device according to the invention will be described with reference to a low-voltage automatic circuit-breaker, without thereby the intention being in any way to limit its field of application.

Figure 1:
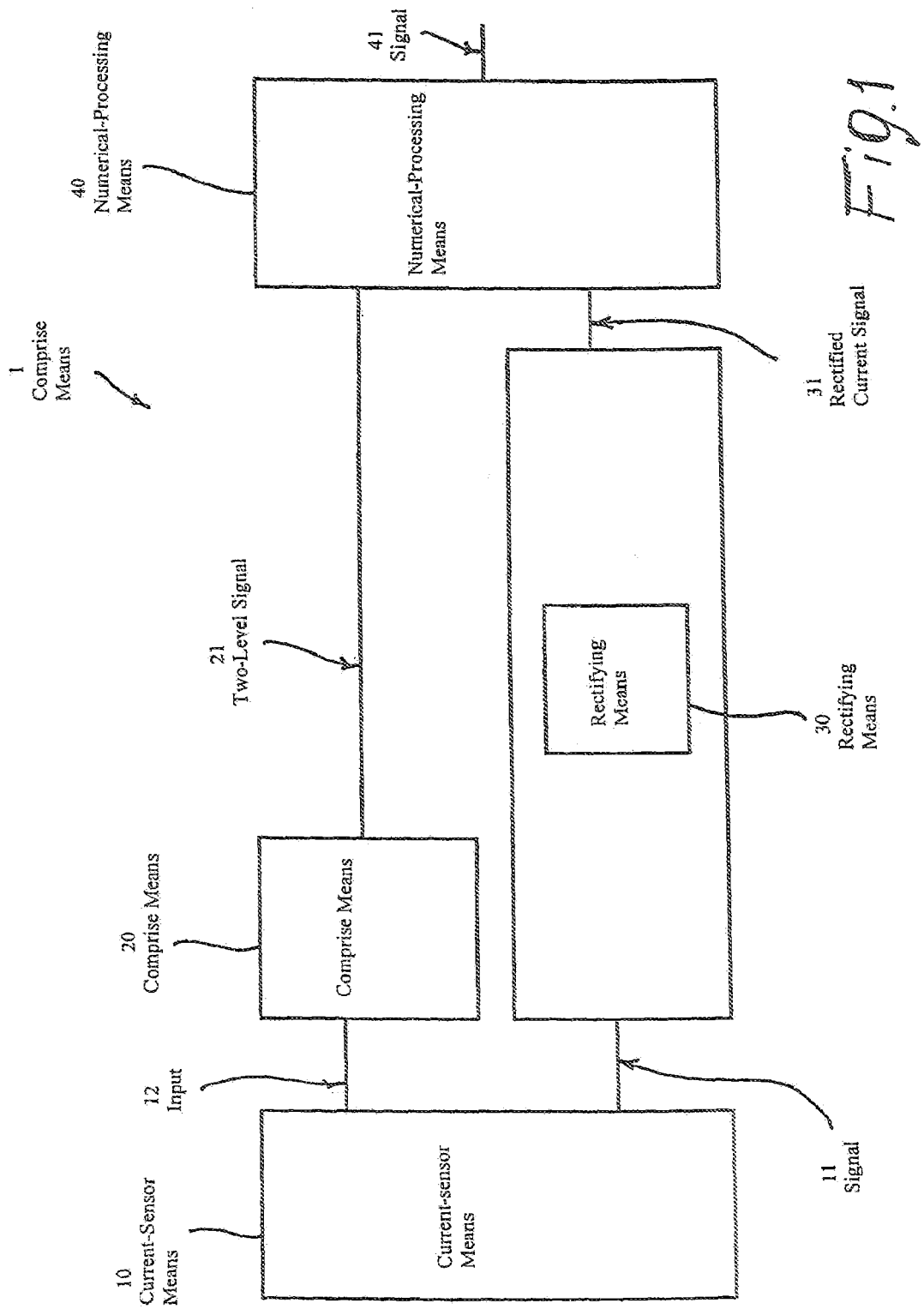
FIG. 1 is a schematic representation of a first embodiment of the electronic tripping device according to the invention.

With reference to FIG. 1, the electronic tripping device for low-voltage circuit-breakers, in particular for low-voltage multipolar automatic circuit-breakers, according to the invention, comprises means 1 for detection and calculation of a ground-fault current that are operatively connected to the tripping means associated to said circuit-breaker.

Said means 1 for detection and calculation comprise, for each pole, current-sensor means 10, which supply a signal 11 proportional to the current that circulates in said pole. The current-sensor means 10 can conveniently be formed by current transformers, in which the signal 11 is generated in the secondary winding of the current transformer as a result of the current circulating in the respective phase conductor that constitutes the primary winding of said transformer.

The means 1 for detection and calculation moreover comprise means 20 for detection of the sign of the current, the input of which is operatively connected to said current-sensor means 10. The means 20 supply at output, for each pole, a two-level signal 21 that represents the sign of the current that circulates in said pole. In practice, the means 20 have, as input 12, the sinusoid arriving from the block 10 and supply at output a two-level signal 21 representing the sign of the sinusoid itself.

Moreover present are means 30 for rectification of the current, the input of which is operatively connected to the current-sensor means 10. The rectifying means 30 supply at output, for each pole, a rectified signal 31 that is proportional to the current circulating in said pole. In practice, the signal 11 coming from the block 10 is rectified for the purpose of supplying energy to the electronic tripping device and of enabling management of the signals processed with a single supply range (only signals of positive amplitude).

Finally, the means 1 comprise first numerical-processing means 40, the input of which is operatively connected to the means 20 for detection of the sign of the current and to the rectifier means 30. The first processing means 40 supply at output, with pre-determined periodicity, a value 41 with sign. Said value with sign 41 represents a ground fault and is obtained by means of a numerical-processing operation, which comprises, for each pole, the multiplication of said two-level signal 21, with the corresponding rectified signal 31, which is proportional to the current circulating in said pole.

It is therefore possible, using relatively simple and far from costly components and carrying out numerical-processing operations that are not complicated to obtain a signal 41 that represents a ground fault.

Figure 2:
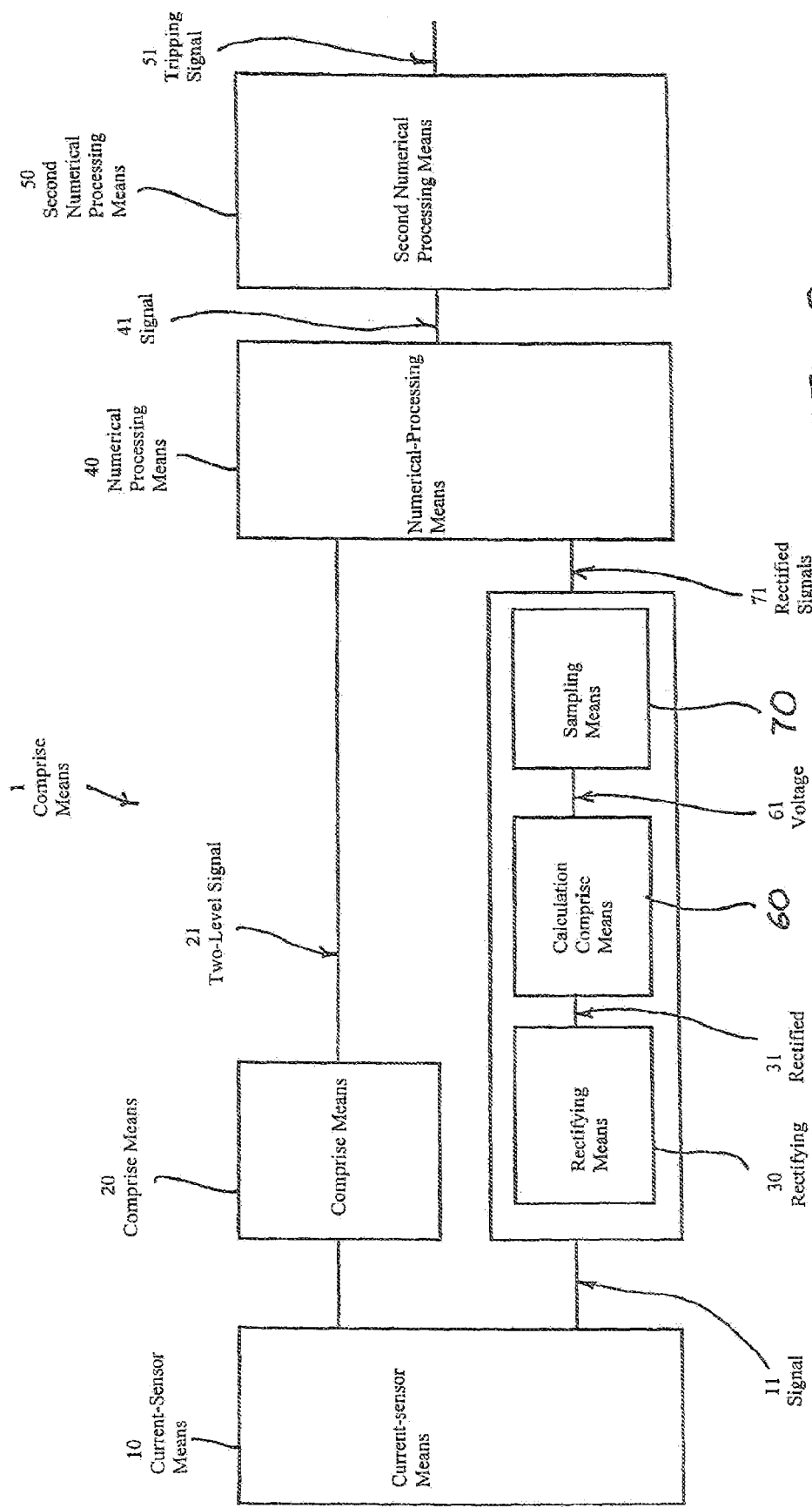
FIG. 2 is a schematic representation of a second embodiment of the electronic tripping device according to the invention.

According to a preferred embodiment of the tripping device according to the invention, which is illustrated in FIG. 2, the means 1 for detection and calculation comprise means 60 of detection of the amplitudes, the input of which is operatively connected to the rectifying means 30, which supply at output a voltage signal 61, which is proportional to the current signal detected by said sensor means. In other words, the rectified current signal 31 coming from the block 30 is transformed into a voltage signal that maintains the characteristics of proportionality with respect to the primary current of the current signal 11.

Once again with reference to FIG. 2, the means 1 for detection and calculation comprise also second numerical-processing means 50, the input of which is operatively connected to the first numerical-processing means 40. The second processing means 50 perform a numerical-processing operation of said value with sign 41 representing a ground fault for reconstructing the effective value RMS of said ground-fault current. The second numerical-processing means 50 generate, on the basis of said effective value RMS of the current, a tripping signal 51 according to pre-set tripping curves. Said tripping signal 51 is sent to the control members of the circuit-breaker that carry out opening of contacts of the associated circuit-breaker.

According to a particularly preferred embodiment, the electronic tripping device according to the invention comprises sampling means 70, the input of which is operatively connected to the means 60 for detection of the amplitudes. The means 70 enable synchronous sampling of all the phases by sending, with predetermined periodicity to said first numerical-processing means 40, rectified signals 71 that are proportional to the current in each pole. The synchronous sampling of all the signals corresponding to all the phases and to the neutral, if present, makes it possible to have an instantaneous image for enabling numerical processing to be carried out more accurately by said first numerical-processing means 40, as described in detail in what follows.

Figure 3:
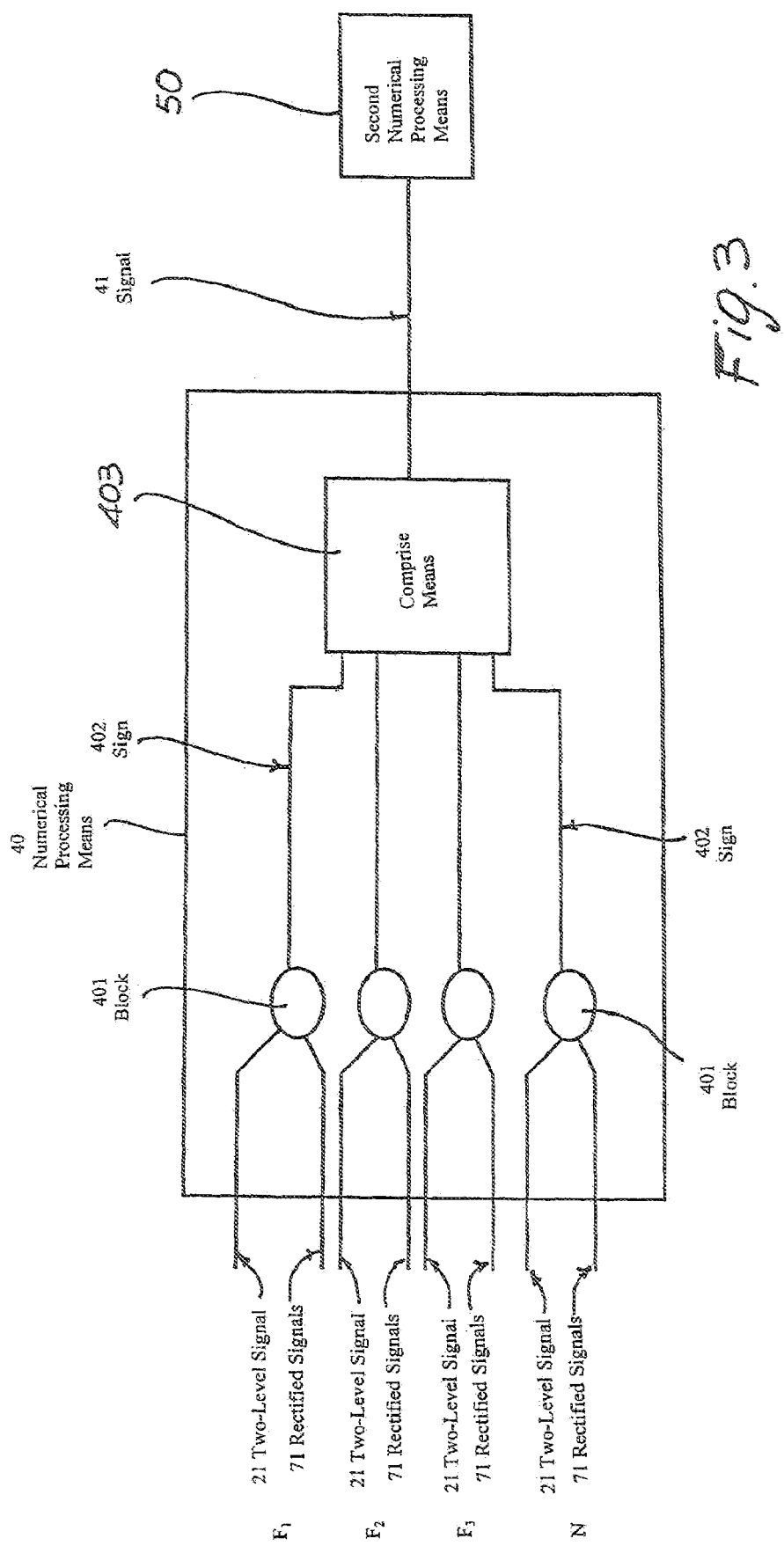
FIG. 3 illustrates in detail the functions of the first numerical-processing means of an electronic tripping device according to the invention.

With reference to FIG. 3, for a tripolar system with neutral, the rectified signals 71, which are proportional to the current in each pole F1, F2, F3, FN, are sent by the block 70 to the first numerical-processing means 40. Said numerical-processing means 40 also receive from the block 20 the corresponding signals 21 representing the sign of the current circulating in each of said poles. Each of said signals 71 is multiplied by the corresponding signal 21 (block 401) to obtain, for each pole, values with sign 402 that are proportional to the current circulating therein.

Conveniently, said values with sign 402, which are proportional to the current in each pole, are obtained by implementing a twos-complement mathematics, dedicating one bit to obtain a number with sign.

The first numerical-processing means 40 moreover comprise means 403 for obtaining the algebraic sum of said values 402 with sign, which are proportional to the current in each pole. Through this operation, the means for obtaining the algebraic sum 403 supply a value with sign 41, which represents a ground fault. From said value 41 a calculation of the effective value RMS of the ground-fault current is performed in block 50. The effective value RMS is used to establish whether or not a pre-set threshold value has been exceeded and to start or otherwise the consequent timing according to pre-set tripping curves.

It is clear from the foregoing description that the electronic tripping device for low-voltage circuit-breakers, in particular for low-voltage multipolar automatic circuit-breakers, according to the invention, presents considerable advantages with respect to the known art both in terms of performance and in terms of production costs.

The electronic tripping device thus devised may undergo numerous modifications and variations, all falling within the scope of the inventive idea. Furthermore, all of the items may be replaced by other technically equivalent elements. In practice, the materials, as well as the dimensions, may be any whatsoever according to the requirements and to the state of the art.

We claim:

1. An electronic tripping device for low-voltage circuit-breakers, comprising means for detection and calculation of a ground-fault current operatively connected to tripping means of said circuit-breaker, said means for detection and calculation comprising:
   current-sensor means that supply, for each pole, a signal proportional to the current circulating therein; means for detection of the sign of the current, the input of which is operatively connected to said current-sensor means, which, for each pole, supply at output a two-level signal representing the sign of the current in said pole;
   current-rectifying means, the input of which is operatively connected to said current-sensor means, which, for each pole, supply at output a rectified signal proportional to the current circulating in said pole; and
   first numerical-processing means, the input of which is operatively connected to said means for detection of the sign of the current and to said rectifying means, said first processing means supplying at output, with a predetermined periodicity, a value with sign representing a ground fault by means of a numerical-processing operation that comprises multiplication for each pole of said two-level signal with the corresponding rectified signal proportional to the current circulating in said pole.

2. The electronic tripping device according to claim 1, further comprising means for detection of the amplitudes, the input of which is operatively connected to said rectifying means, which supply at output a voltage signal proportional to the current signal detected by said sensor means.

3. The electronic tripping device according to claim 1, further comprising second numerical-processing means, the input of which is operatively connected to said first numerical-processing means, said second processing means executing a numerical-processing operation of said value with sign representing a ground fault for reconstructing the effective value RMS of said ground-fault current.

4. The electronic tripping device according to claim 3, wherein said second numerical-processing means generate, on the basis of said effective value RMS of the current, a tripping signal according to pre-set tripping curves.

5. The electronic tripping device according to claim 2, further comprising sampling means, the input of which is operatively connected to said means for detection of the amplitudes, which enable synchronous sampling of all the phases by sending, with a predetermined periodicity to said first numerical-processing means, rectified signals proportional to the current in each pole.

6. The electronic tripping device according to claim 5, wherein said rectified signals proportional to the current in each pole are multiplied by the corresponding two-level signal representing the sign of the current in each pole, obtaining for each pole values with sign that are proportional to the current circulating therein.

7. The electronic tripping device according to claim 6, wherein said values with sign proportional to the current in each pole are obtained by implementing a twos-complement mathematics, dedicating one bit to obtain a number with sign.

8. The electronic tripping device according to claim 6 or claim 7, wherein said first numerical-processing means comprise means for obtaining the algebraic sum of said values with sign proportional to the current in each pole, said means for obtaining the algebraic sum supplying a value with sign that represents a ground fault.

9. The electronic tripping device according to claim 1, wherein the low voltage circuit breakers further comprise low-voltage multi-polar automatic circuit breakers.

* * * * *